United States Patent [19]
Jackson

[11] Patent Number: 4,800,342
[45] Date of Patent: Jan. 24, 1989

[54] FREQUENCY SYNTHESIZER OF THE FRACTIONAL TYPE

[75] Inventor: Thomas Jackson, Hanwell, Great Britain

[73] Assignee: Plessey Overseas Limited, Ilford, England

[21] Appl. No.: 925,632

[22] PCT Filed: Feb. 21, 1986

[86] PCT No.: PCT/GB86/00090
§ 371 Date: Nov. 24, 1986
§ 102(e) Date: Nov. 24, 1986

[87] PCT Pub. No.: WO86/05045
PCT Pub. Date: Aug. 28, 1986

[30] Foreign Application Priority Data

Feb. 21, 1985 [GB] United Kingdom ............... 8504542

[51] Int. Cl.⁴ .................................................. H03L 7/00
[52] U.S. Cl. ........................................ 331/10; 331/16; 331/17; 455/76
[58] Field of Search ............... 331/1 A, 10, 14, 16, 331/17, 25; 455/76; 375/120; 364/724, 745

[56] References Cited

U.S. PATENT DOCUMENTS 4,223,389 9/1980 Amada et al. ..................... 364/724

FOREIGN PATENT DOCUMENTS 0125790 11/1984 European Pat. Off. .
2026268 1/1980 United Kingdom .

OTHER PUBLICATIONS

IEEE Trans. on Com., vol. COM-23, No. 2, Feb. 1975, New York, Van Gerwen et al., "A New Type of Digital Filter for Data Transmission", pp. 222-234.

Primary Examiner—Eugene R. LaRoche
Assistant Examiner—Robert J. Pascal
Attorney, Agent, or Firm—Michael F. Oglo; Julian C. Renfro

[57] ABSTRACT

A frequency synthesizer of the fractional N type comprising a voltage controlled oscillator for producing an output signal which is afforded to a phase detector via a variable divider to provide a control signal for the voltage controlled oscillator in the presence of a phase difference between a reference signal from a reference source and the signal afforded thereto from the variable divider wherein the division ratio of the variable divider is set in dependence upon the output of an interpolator arrangement comprising combiner means for receiving a digital input, digital controller means for receiving an output from the combiner means, digital slicer means for receiving an output from the digital controller means, feedback means for affording the output of the digital slicer means to a component for varying the division ratio of the variable divider.

8 Claims, 5 Drawing Sheets

FREQUENCY SYNTHESIZER OF THE FRACTIONAL TYPE

BACKGROUND OF THE INVENTION

The present invention relates to improvements in synthesisers of the fractional N type and in particular, to improvements for compensating the ripple signal produced in such synthesisers when operating in the fractional N mode.

Frequency synthesisers usually comprise a voltage controlled oscillator (VCO) for providing an output signal and arranged in a phase lock loop. In order to adjust the frequency of the output signal of the synthesiser the output signal of the VCO is fed via a variable divider to a phase detector which provides a control signal to the VCO in the presence of a phase difference between a reference signal from a reference source and the output signal from the variable divider. The output frequency of such synthesisers can, however, only be varied as a multiple of the reference signal frequency and it is usually desirable to vary the output frequency in relatively small increments. If the reference signal frequency is reduced in order to produce sufficiently small increments the settling time of the synthesiser may be increased to an extent such that it is impractical for many applications. It has, therefore, previously been proposed to include additional circuitry in the synthesiser to enable operation in the fractional N mode and such synthesisers are generally known as fractional N synthesisers. In a fractional N synthesiser the division ratio N of the variable divider is controlled in multiples of N such that, over a number of cycles of the reference signal, the mean value of the division ratio, termed N mean, is the desired fraction of the division ratio N.

However, the operation of the synthesiser in the fractional N mode usually gives rise to a ripple signal, which in view of the phase lock loop configuration in the synthesiser, produces frequency modulation of the output signal from the voltage controlled oscillator and hence, the output signal has poor spectral purity.

In order to compensate for the ripple signal it has been proposed to include a phase modulator between the variable divider and phase detector of the phase lock loop. The phase modulator is driven with a drive signal in order to provide compensation of the ripple signal. However, accurate compensation of the ripple signal is heavily dependent on the accurate setting of the level of the drive signal to the phase modulator. Previous attempts to use feedback control to correct the level of the drive signal, and thus to provide optimum compensation of the ripple signal, have relied upon the extraction of a ripple rate signal from the control signal for the voltage controlled oscillator. However, the amplitude of the ripple signal is small compared to the amplitude of the control signal of the VCO and hence, it is difficult to control accurately the level of the drive signal for the phase modulator.

At present most fractional-N synthesisers are interpolated using either a single or a double accumulator scheme to obtain sub-reference rate output frequencies. In both cases the accumulators produce a bit stream which is applied to the variable divider. The integral of the bit stream is applied via a D/A converter to the synthesiser phase detector output. The sidebands produced by the interpolation are therefore cancelled leaving the induced frequency shift intact.

The single accumulator scheme works well so long as good tracking between the cancellation waveform and the ripple at the phase detector output is maintained. This is not easily achieved with variations in temperature, ageing and vibration. Also the initial calibration is extremely difficult due to the high sensitivities involved.

The double accumulator scheme produces a more efficient output bit stream which actually spreads out the unwanted interpolation sidebands. This results in a reduction of sideband amplitude at a rate of 20 dB per decade of interpolation over a single accumulator scheme. It achieves this by running two accumulators in a series/parallel arrangement. The two output bit streams are suitably combined to form another more efficient bit stream. Thus the matching of the cancellation waveform is relaxed by an order of magnitude and the problems associated with good tracking are much reduced.

The double accumulator scheme is a sub optimum system because there are additional sidebands present which produce "temporary phase shifts" within the synthesiser. This reduces the performance possible from such a system.

SUMMARY OF THE INVENTION

An objective of the present invention is to provide an interpolation scheme the system design of which will reduce the interpolation sidebands and improve the performance of the synthesiser.

According to the present invention there is provided a frequency synthesiser of the fractional N type comprising a voltage controlled oscillator for producing an output signal which is afforded to a phase detector via a variable divider to provide a control signal for the voltage controlled oscillator in the presence of a phase difference between a reference signal from a reference source and the signal afforded thereto from the variable divider wherein the division ratio of the variable divider is set in dependence upon the output of an interpolator arrangement comprising combiner means for receiving an input, controller means for receiving an output from the combiner means, digital slicer means for receiving an output from the controller means, feedback means for affording the output of the digital slicer means to the combiner means and output means for affording the output of the digital slicer means to a component for varying the division ratio of the variable divider.

In one embodiment of the present invention the controller means comprises summing means for receiving the output from the combiner means, delay means coupled to the summing means, and a feedback loop for affording the output of the delay means to the summing means.

In a more preferred embodiment the controller means comprises summing means for receiving the output from the combiner means, first delay means coupled to the summing means, second delay means coupled to the first delay means, further summing means coupled to the second delay means, a feedback loop for affording the output of the further summing means to the summing means, and a feed forward loop, including multiplier means, for affording an output from the first delay means to the further summing means.

In a still more preferred embodiment the controller means comprises summing means for receiving the output from the combiner means, first delay means coupled to the summing means, second delay means coupled to the first delay means, third delay means coupled to the second delay means, further summing means coupled to the third delay means, a feedback loop for affording the output of the further summing means to the summing means, a first feed forward loop, including first multiplier means, for affording an output from the first delay means to the further summing means, and a second feed forward loop, including second multiplier means, for affording an output from the second delay means to the further summing means.

Conveniently the delay means comprise D-type flip-flops.

Conveniently the component whose output signal controls the division ratio of the variable divider is in the form of an adder.

In a preferred embodiment of the present invention further feedback means are provided for feeding the output of the digital slicer via an integrator to a combiner means arranged to receive the output of the phase detector.

The combiner means for receiving the output of the phase detector may take the form of a subtractor or adder. If in the form of an adder then an inverter is provided in the further feedback means.

BRIEF DESCRIPTION OF THE DRAWINGS

The present invention will be described further, by way of examples, with reference to the accompanying drawings in which.

DESCRIPTION OF AN EMBODIMENT OF THE INVENTION

Figure 1A:
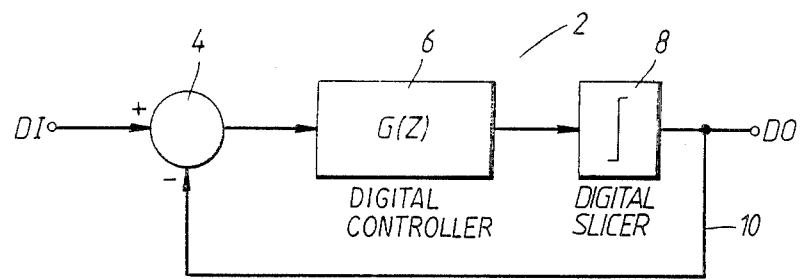
FIG. 1A is a schematic block diagram of an interpolator incorporating a one bit quantiser.

Referring to FIG. 1A, an interpolator 2 comprises combiner means 4, which may take the form of an X-bit adder, for receiving a digital input D1. The combiner means 4 is connected to a digital controller means 6, the output of which is connected to a one bit quantiser in the form of a digital slicer means 8. Feedback means is provided, in the form of a feedback control loop 10, between the output of the slicer 8 and the combiner means 4.

The interpolator shown in FIG. 1 limits cycles to produce an output bit stream Do which has a mean mark to space ratio proportional to the digital input word D1 divided by the limiting value S of the slicer 8.

In one embodiment of the present invention this output bit stream Do is added to the LSB of the variable divider data N1 (FIG. 5) so that a synthesiser is suitably interpolated.

Figure 1B:
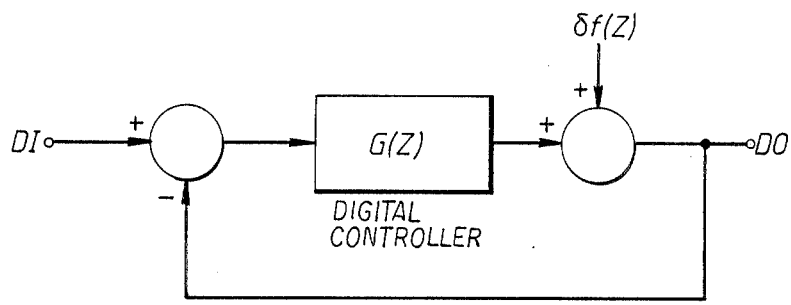
FIG. 1B is a schematic block diagram of the noise model of the interpolator shown in FIG. 1A.

FIG. 1B illustrates the noise model of the interpolator 2 where df(Z) is the quantisation noise of the one bit quantiser 8 shown in FIG. 1. The quantisation noise produces the unwanted interpolation sidebands.

If G(z) is the gain of the digital controller means 6 then:

$$Do(z) = \frac{Di(z) G(z)}{1 + G(z)} + \frac{df(z)}{1 + G(z)} \qquad (1)$$

From this expression it can be seen that as G(z) tends towards infinity, the unwanted sidebands due to df(z) tends to zero. This means that as G(z) is increased a more efficient interpolation sequence results.

The noise term Eq(z) due to df(z) may be expressed as:

$$Eq(z) = \frac{df(z)}{1 + G(z)} \qquad (2)$$

The interpolator 2 may be analysed as follows:

Let: $\frac{Do(z)}{Di(z)} = M(z)$ then the gain of the digital controller means 6:

$$G(z) = \frac{M(z)}{1 - M(z)} \qquad (3)$$

It can be seen that equation (3) determines the open loop gain of the system and it is maximised by choosing the fastest closed loop response to a given type of input; such as by the use of an optimum controller for the digital controller means 6, the optimum value for G(z) occurring when the closed loop exhibits a "Deadbeat" response. "Deadbeat" response is described in detail in section 10.8 of "Digital Control Systems" by Benjamin C. Kuo published by Holt/Saunders International Editions, the subject matter of which is incorporated herein by reference. Increasing the type of loop greater reduction of Eq (the error or noise term of the interpolator 2), with respect to interpolation offset frequency. Table A below shows the required controller G(z) for maximum reduction of the noise term Eq for three types of loop.

| LOOP | IMPULSE RESPONSE | DIGITAL CONTROLLER |
|------|------------------|---------------------|
| 1    | $z^{-1}$         | $\frac{z^{-1}}{1-z^{-1}}$ |
| 2    | $2z^{-1} - z^{-2}$ | $\frac{2z^{-1} - z^{-2}}{1 - 2z^{-1} + z^{-2}}$ |
| 3    | $3z^{-1} - 3z^{-2} + z^{-3}$ | $\frac{3z^{-1} - 3z^{-2} + z^{-3}}{1 - 3z^{-1} + 3z^{-2} - z^{-3}}$ |

Where $z^{-1}$ is a delay of 1 sample period.

Suitable digital controllers of which the types 1, 2 and 3 optimum controllers referred to in Table A are merely illustrative, are described in detail in Chapter 17 of "Feedback Control System Analysis and Synthesis" by J. J. D'Azzo and C. H. Houpis published by McGraw Hill, the subject matter of which is incorporated herein by reference.

Figure 2:
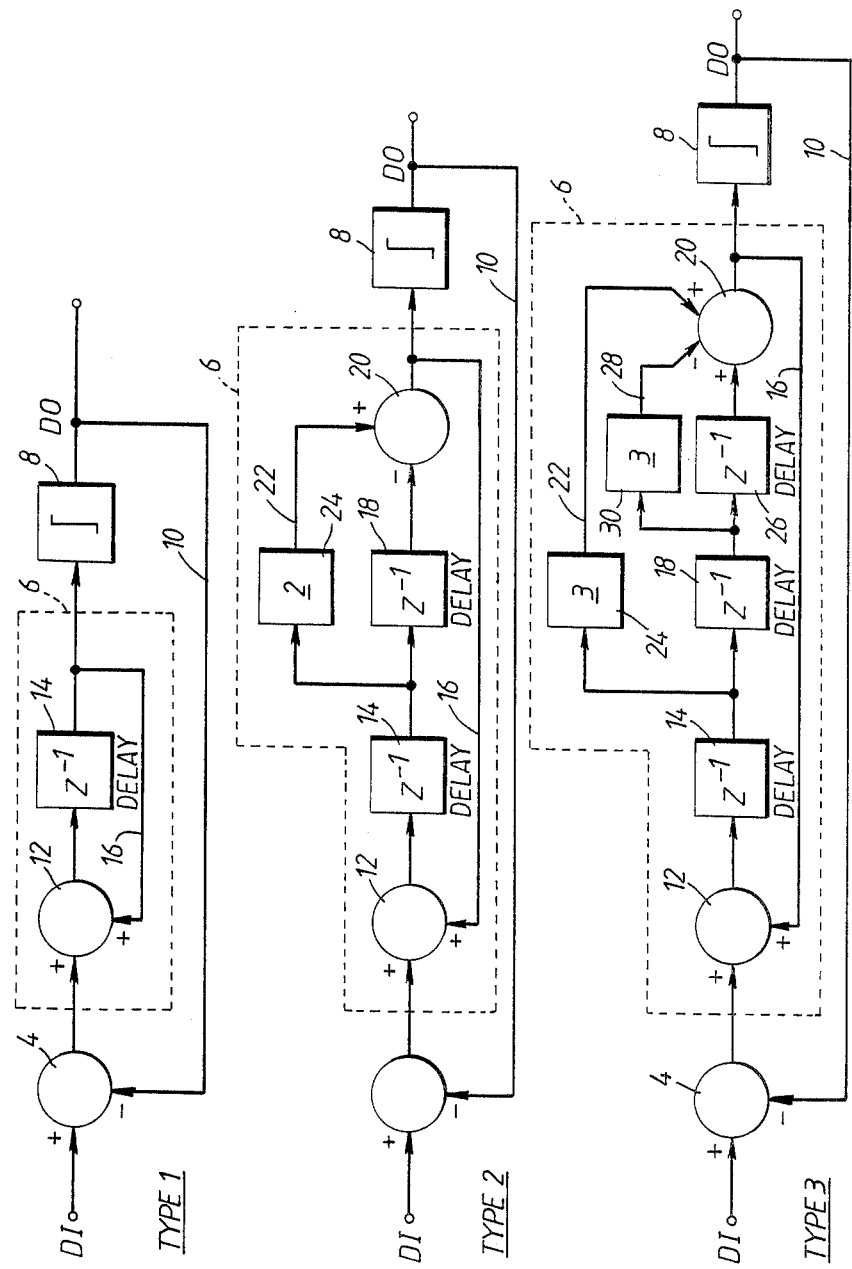
FIG. 2 illustrates schematic block diagrams of three types of interpolator.

The respective loop block diagrams for type 1, type 2 and type 3 digital controllers are shown in FIG. 2.

It can be seen from FIG. 2 that the type 1 digital controller comprises summing means 12 in combination with delay means 14 and a feedback loop 16 connecting the output of the delay means 14 to the summing means 12.

The type 2 digital controller, shown in FIG. 2, includes a second delay means 18, further summing means 20 and a feed forward loop 22 including a multiplier 24.

The type 3 digital controller, shown in FIG. 2, includes a third delay means 26 and a second feed forward loop 28 including a multiplier 30. The delay means 14, 18 and 26 used in these controllers may comprise D-type flip-flops.

The relative reduction in sideband level for a given type of loop is given in equation (4) below:

$$R = 20 \, \text{Log}_{10} \left( \frac{N1 + V2}{2V} \right)^T \quad (4)$$

where:

$$V = \tan \frac{\pi F_o}{F_s}$$

Fs=synthesiser reference frequency
T=type of loop

Figure 3:
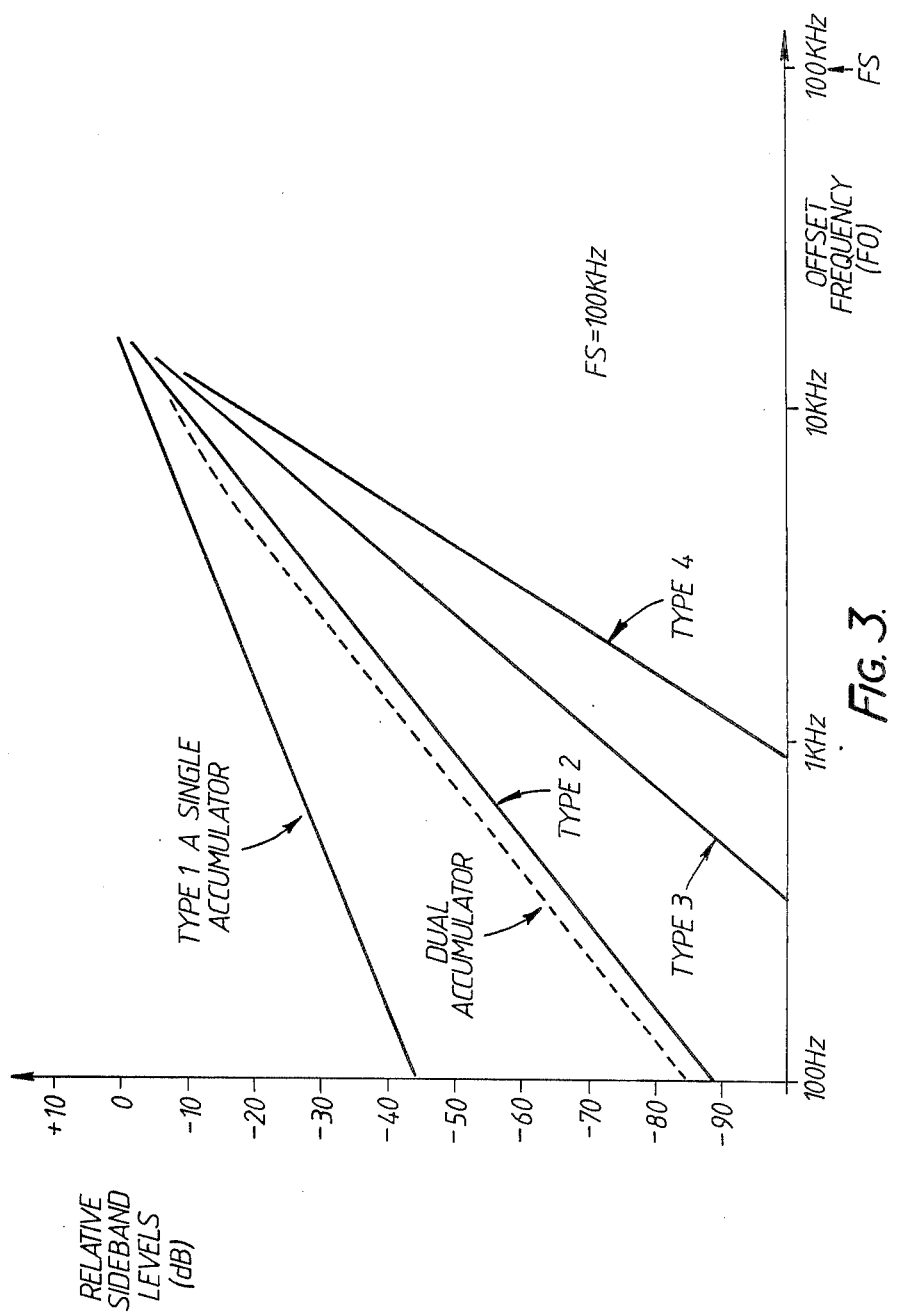
FIG. 3 is a graph showing sideband levels against offset frequency.

FIG. 3 shows equation (4) plotted for a synthesiser with a 100 KHz reference rate.

From equation (2):

$$EQ(z) = df(z)/(1+G(z))$$

in which W is a plane having a relationship to the Z plane expressed by $W = az + b/cz + d$ where a,b,c and d are constants Taking the Bi-linear transform gives:

$$Eq(W) = df(w) \left[ \frac{2W}{1+W} \right]^T$$

This shows that the unwanted noise df is shaped by a characteristic of:

$$F(W) = \left( \frac{2W}{1+W} \right)^T$$

This means that if all the sidebands due to interpolation are required to be less than or equal in amplitude to that caused at an offset Fx, then the resulting synthesiser must have an order greater or equal to T+1 with a bandwidth Fx. This statement assumes that the level of the sideband at Fx is already low enough for phase cancellation to be unnecessary.

Consider the type 3 interpolator shown in FIG. 2. Let:
Fs=Synthesiser clock
Foff=Offset frequency
S=Limited value of slicer
D1=Offset data Foff=D1 Fs/S Let the offset frequency be in multiples of 100 Hz and the synthesiser clock be 100 KHz.
therefore:

S=1000

Foff=100D$_1$ Hz

Figure 4:
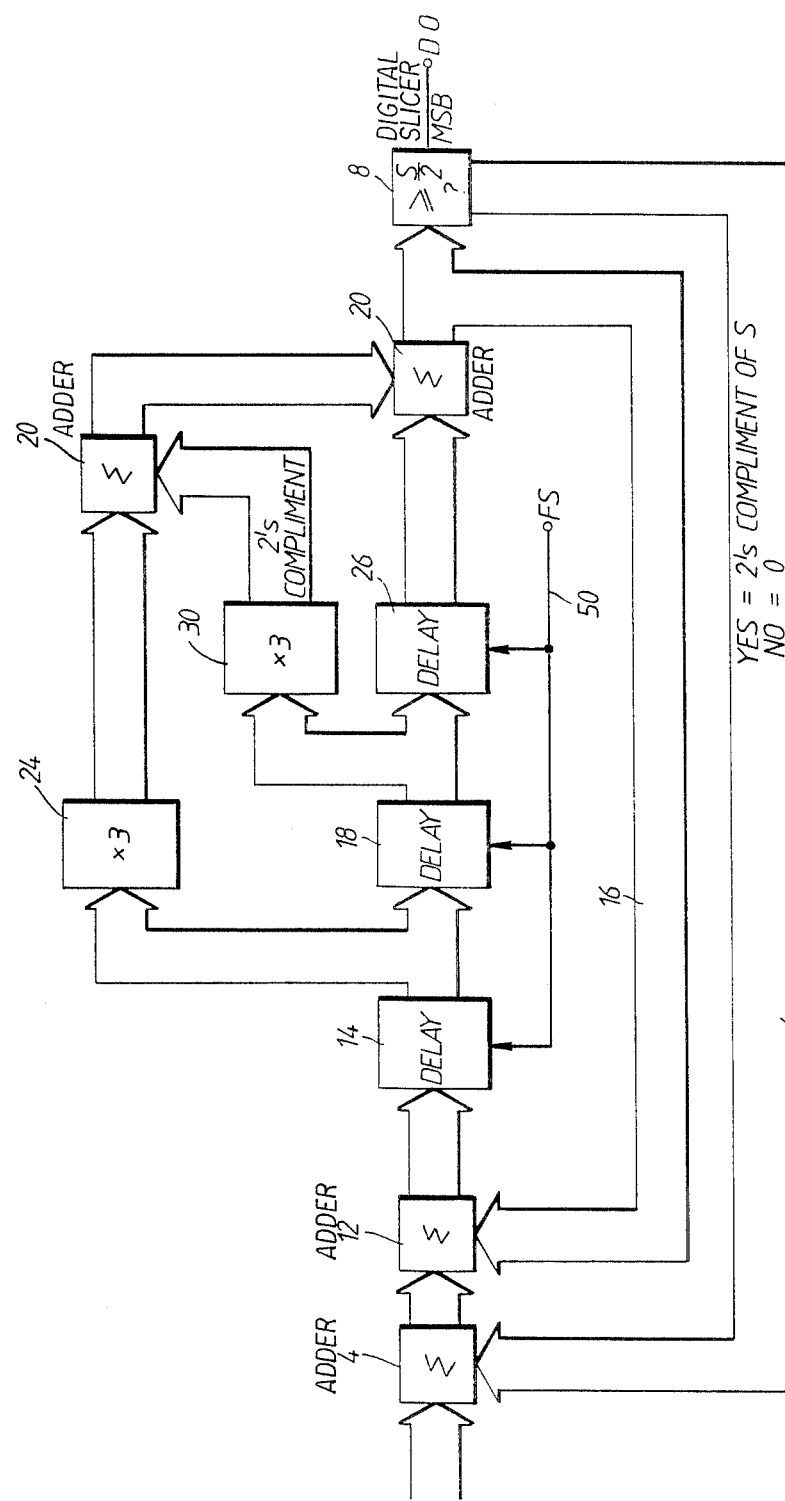
FIG. 4 is a preferred interpolator arrangement.

FIG. 4 shows a practical realisation of the type 3 interpolator the function of which will be understood with reference to FIG. 2. There must be sufficient headroom in G(z) for the system to operate linearly. Do is added to N$_1$.

FIG. 3 shows that if a 4th order synthesiser having a 1 KHz bandwidth is used then the sidebands on Of produced by the type 3 interpolator will all be 50 dB better than those produced by a type 1 system. These sideband levels are fixed over the lifetime of the synthesiser and over any temperature range.

As explained above we have found that the new class of interpolators outperform currently available types by producing more efficient interpolation sequences. These new interpolators are based on non-linear "Deadbeat" control systems which offer optimum performance in this application.

For ease of identification, they are classified above by type number. The type of the control system is denoted by the number of delays contained within it. For interpolators of type 3 and above, the sequences produced are so efficient that phase cancellation of unwanted sidebands is unnecessary.

Figure 5:
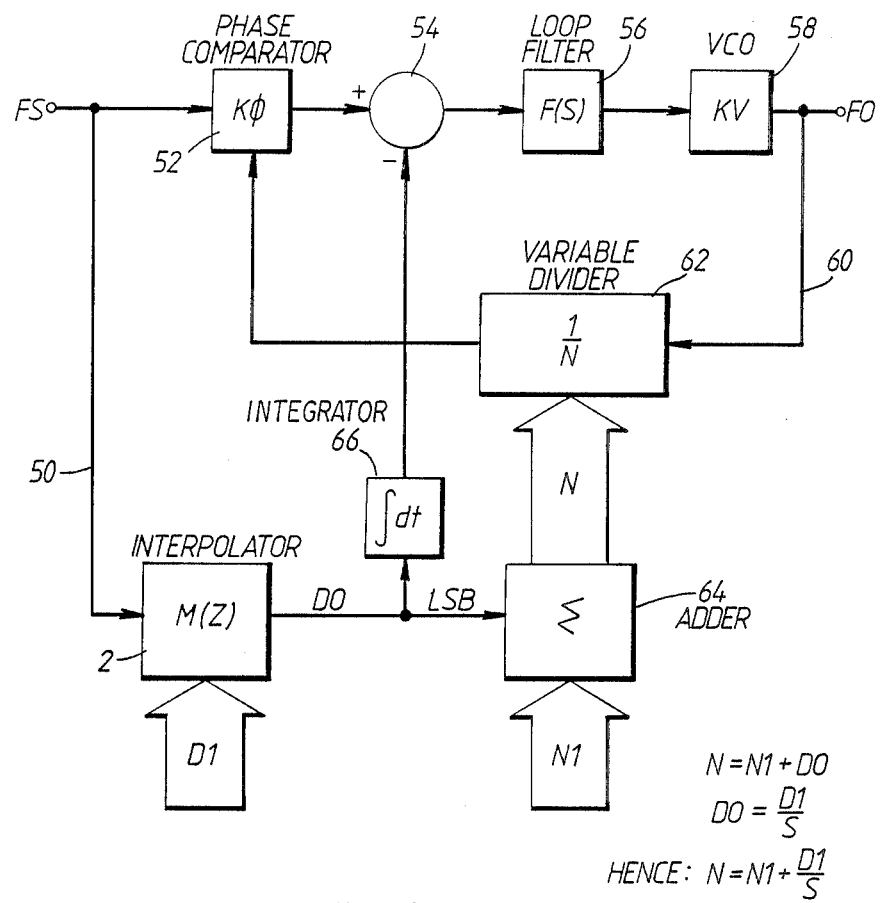
FIG. 5 is an interpolated frequency synthesiser according to an embodiment of the present invention.

FIG. 5 shows how such interpolators are used in accordance with an embodiment of the present invention. The output bit stream Do is added to the LSB of the variable divider data. This enables frequency offsets to be obtained which are less than the clock rate Fs.

If Of is the synthesiser output frequency, then:

Of=Fs (N1+D1/S)

where S>D1
and Foff=FsD1/S

The value of S is determined by the characteristics of the interpolator. Foff is the offset frequency produced by the interpolation.

Sideband cancellation is possible by taking the integral of Do and subtracting it from the phase detector output voltage.

Referring more particularly to FIG. 5 there is illustrated the manner in which the interpolators are incorporated into a synthesiser design in accordance with an embodiment of the present invention.

The reference frequency Fs is fed along a line 50 to the delays in interpolator 2 (see FIG. 4) and to a phase comparator 52. The phase comparator 52 is coupled to a loop filter 56 via combiner means, in the form of a subtractor 54, the output from the loop filter 56 being fed to a voltage controlled oscillator 58. The output signal from the oscillator 58 is fed back to the phase comparator 52 via a variable divider 62 in a feedback line 60. Data N1 is fed to an adder 64 which together with the data Do supplied by the interpolator 2 to the adder 64 provide data N for varying the division ratio of the variable divider 62. Sideband cancellation is accomplished by feeding the data Do via an integrator 66 and subtracting the integral of Do from the phase detector output voltage at the subtractor 54.

Although the present invention has been described with respect to particular embodiments, it should be understood that modifications may be effected within the scope of the invention.

I claim:

1. A frequency synthesiser of the fractional N type comprising a voltage controlled oscillator for producing an output signal which is afforded to a phase detector via a variable divider to provide a control signal for the voltage controlled oscillator in the presence of a phase difference between a reference signal from a reference source and the signal afforded from the variable divider wherein the division ratio of the variable divider is set in dependence upon the output of an interpolator arrangement comprising combiner means for receiving a digital input, digital controller means for receiving an output from the combiner means, digital slicer means for receiving an output from the digital controller means, and feedback means for affording the output of the digital slicer means to a component of the synthesiser for varying the division ratio of the variable divider, the said digital controller means comprising summing means for receiving the output from the said combiner means, delay means coupled to the said summing means, and a feedback loop for affording the output of the delay means to the said summing means.

2. A frequency synthesiser according to claim 1 wherein the component whose signal controls the division ratio of the variable divider is in the form of an adder.

3. A frequency synthesiser according to claim 1 wherein further feedback means are provided for feeding the output of the digital slicer via an integrator to a combiner means arranged to receive the output of the phase detector.

4. A frequency synthesiser according to claim 3 wherein the combiner means for receiving the output of the phase detector is in the form of a subtractor.

5. A frequency synthesiser according to claim 3 wherein the combiner means for receiving the output of the phase detector is in the form of an adder, an inverter being provided in the further feedback means.

6. A frequency synthesiser of the fractional N type comprising a voltage controlled oscillator for producing an output signal which is afforded to a phase detector via a variable divider to provide a control signal for the voltage controlled oscillator in the presence of a phase difference between a reference signal form a reference source and the signal afforded thereto from the variable divider wherein the division ratio of the variable divider is set in dependence upon the output of an interpolator arrangement comprising combiner means for receiving a digital input, digital controller means for receiving an output from the combiner means, digital slicer means for receiving an output from the digital controller means, and feedback means for affording the output of the digital sliver means to a component of the synthesiser for varying the division ratio of the variable divider the said digital controller means comprising summing means for receiving the output form the said combiner means, first delay means coupled to the said summing means, second delay means coupled to the said first delay means, further summing means coupled to the said second delay means, a feedback loop for affording the output of the said further summing means to the said summing means, and a feed forward loop, including multiplier means, for affording an output from the said first delay means to the said further summing means.

7. A frequency synthesiser of the fractional N type comprising a voltage controlled oscillator for producing an output signal which is afforded to a phase detector via a variable divider to provide a control signal for the voltage controlled oscillator in the presence of a phase difference between a reference signal from a reference source and the signal afforded thereto from the variable divider wherein the division ratio of the variable divider is set in dependence upon the output of an interpolator arrangement comprising combiner means for receiving a digital input, digital controller means for receiving an output from the combiner means, digital slicer means for receiving an output from the digital controller means, and feedback means for affording the output of the digital silver means to a component of the synthesiser for varying the division ratio of the variable divider the said digital controller means comprising summing means for receiving the output from the said combiner means, first delay means coupled to the said summing means, second delay means coupled to the said first delay means, third delay means coupled to the said second delay means, further summing means coupled to the said third delay means, a feedback loop for affording the output of the said further summing means to the said summing means, a first feed forward loop, including first multipliers means, for affording an output from the said first delay means to the said further summing means and a second feed forward loop, including second multiplier means, for affording an output from the said second delay means to the said further summing means.

8. A frequency synthesiser according to claim 7 wherein the delay means comprise D-type flip-flops.

* * * * *